(12) United States Patent
Kim et al.

(10) Patent No.: US 7,872,324 B2
(45) Date of Patent: Jan. 18, 2011

(54) SUSPENDED NANOWIRE SENSOR AND METHOD FOR FABRICATING THE SAME

(75) Inventors: Yong-Shin Kim, Daejon (KR); Youn-Tae Kim, Daejon (KR); Duck-Gun Park, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 165 days.

(21) Appl. No.: 11/931,064

(22) Filed: Oct. 31, 2007

(65) Prior Publication Data

US 2008/0224717 A1    Sep. 18, 2008

(30) Foreign Application Priority Data

Dec. 4, 2006   (KR) .................. 10-2006-0121202
Aug. 21, 2007  (KR) .................. 10-2007-0083836

(51) Int. Cl.
*H01L 27/14*    (2006.01)
*H01L 51/44*    (2006.01)
*H01L 51/48*    (2006.01)

(52) U.S. Cl. .............................. 257/448; 257/E51.012; 438/49; 438/57; 977/720; 977/762; 977/890

(58) Field of Classification Search ................. 257/431, 257/448, E51.012, E51.026; 438/49, 57, 438/421; 977/720, 750, 762, 811, 814, 855, 977/857, 858, 890, 932

See application file for complete search history.

(56) References Cited

U.S. PATENT DOCUMENTS 6,700,759 B1 *  3/2004  Knapp et al. ............. 360/324.2
6,849,911 B2    2/2005  Monty et al.
7,446,044 B2 * 11/2008  Kaul et al. ................... 438/684
7,485,908 B2 *  2/2009  Anwar et al. ................. 257/296
2005/0166292 A1 *  7/2005  Lee ......................... 977/DIG. 1
2005/0227017 A1 * 10/2005  Senzaki et al. .............. 427/459
2006/0237805 A1 * 10/2006  Segal et al. ................. 257/414
2007/0045756 A1 *  3/2007  Chang et al. ................ 257/414
2007/0208243 A1 *  9/2007  Gabriel et al. .............. 600/347

FOREIGN PATENT DOCUMENTS

| KR | 1020020003464 A | 1/2002 |
| KR | 1020030080833   | 10/2003 |
| KR | 1020050038988   | 4/2005 |
| KR | 1020050090285 A | 9/2005 |
| KR | 1020060068534   | 6/2006 |

OTHER PUBLICATIONS

Kong el al., Nanotube Molecular Wires as Chemical Sensors, Science 287, 622, 2000, pp. 622-625.

* cited by examiner

*Primary Examiner*—Sue Purvis
*Assistant Examiner*—W. Wendy Kuo
(74) *Attorney, Agent, or Firm*—Rabin & Berdo, P.C.

(57) ABSTRACT

Provided is a suspended nanowire sensor having good sensing characteristics and suitable for mass production, a method for fabricating the suspended nanowire sensor. The suspended nanowire sensor includes: first and second sensor electrodes formed on upper portions of a substrate and physically separated from each other; and a nanowire sensor material piece extending from the first sensor electrode to the second sensor electrode and physically suspended between the first and second sensor electrodes.

18 Claims, 9 Drawing Sheets

SUSPENDED NANOWIRE SENSOR AND METHOD FOR FABRICATING THE SAME

BACKGROUND OF THE INVENTION

1. Field of the Invention

The present invention relates to a sensor and a method for fabricating the sensor; and, more particularly, to a suspended nanowire sensor having good sensing characteristics and suitable for mass production, a method for fabricating the suspended nanowire sensor.

This work was supported by the National Research Laboratory (NRL) program of the Korean Ministry of Science and Technology (MOST)/the Korea Science and Engineering Foundation (KOSEF).

2. Description of Related Art

Much research is being conducted on nanomaterial sensors. Owing to specific characteristics of nanomaterials such as a relatively large surface area compared with a small size, uniform properties, and unique chemical reactive properties, nanomaterial sensors can have better performance than other sensors. For example, it is known that when a chemical sensor is formed of a metal oxide having a uniform and nanoscale particle size, the sensing characteristics of the chemical sensor can be largely improved.

Furthermore, some research articles (Science 287, 622) show that the use of a carbon nanotube (CNT) material for sensors increases the operating temperature range and sensitivity of the sensors and reduces the size of the sensors. In addition, it is also known that the use of other nanomaterials such as semiconductor silicon nanowires and metal oxide nanowires allows an improvement in the characteristics of sensors.

Although many synthesis technologies for nanomaterials such as nanowires or CNTs have been developed, the development of nanomaterial devices such as nanowire sensors and manufacturing technologies for the nanomaterial devices is insufficient.

FIG. 1 is a cross-sectional view illustrating a conventional nanowire sensor. Referring to FIG. 1, the conventional nanowire sensor includes a substrate 11, an insulation layer 12 formed on the substrate 11, a nanowire sensor material layer 14 formed on the insulation layer 12, and sensor electrodes 13 contacting the nanowire sensor material layer 14. The nanowire sensor material layer 14 can be directly formed above the substrate 11. Alternatively, the nanowire sensor material layer 14 can be formed by applying a liquid containing nanowires to the substrate 11.

The conventional nanowire sensor can be classified into two types according to the shape of the nanowire sensor material layer 14. In one type, the nanowire sensor material layer 14 is made up of one or several pieces. In the other type, the nanowire sensor material layer 14 is made up of plural pieces that are formed of a nanowire aggregation and are arbitrarily arranged above the substrate 11.

In the former type, the sensor electrodes 13 are connected to the pieces of the nanowire sensor material layer 14 by aligning the sensor electrodes 13 with the pieces of the nanowire sensor material layer 14 using information about the locations of the pieces of the nanowire sensor material layer 14 obtained using a scanning electron microscope (SEM) or an atomic force microscope (AFM). Therefore, the nanowire sensor of the former type is not suitable for mass production although it has good sensing characteristics.

In the latter type, since the pieces of the nanowire sensor material layer 14 are arbitrarily arranged, although the nanowire sensor is suitable for mass production, the sensing characteristics of the nanowire sensor can deteriorate due to interaction between the arbitrarily arranged pieces of the nanowire sensor material layer 14.

Moreover, since the nanowire sensor material layer 14 is attached to the substrate 11, the sensing characteristics of the nanowire sensor can deteriorate due to interaction between the nanowire sensor material layer 14 and the substrate 11.

SUMMARY OF THE INVENTION

An embodiment of the present invention is directed to providing a suspended nanowire sensor suitable for mass production, and a method for fabricating the suspended nanowire sensor.

Another embodiment of the present invention is directed to providing a suspended nanowire sensor having good sensing characteristics by using a plurality of nanowire sensor material pieces and minimizing interaction between the nanowire sensor material pieces, and a method for fabricating the suspended nanowire sensor.

Another embodiment of the present invention is directed to providing a suspended nanowire sensor in which interaction between a substrate and a nanowire sensor material piece is effectively prevented for good sensing characteristics, and a method for fabricating the suspended nanowire sensor.

In accordance with an aspect of the present invention, there is provided a suspended nanowire sensor, which includes: first and second sensor electrodes formed on upper portions of a substrate and physically separated from each other; and a nanowire sensor material piece extending from the first sensor electrode to the second sensor electrode and physically suspended between the first and second sensor electrodes. Herein, a trench may be formed in a portion of the substrate corresponding to a portion of the nanowire sensor material piece suspended between the first and second sensor electrodes.

The nanowire sensor material piece may be formed of a material having electric conductivity varying in response to a chemical species or light, and the nanowire sensor material piece may include a nanowire formed of a material selected from the group consisting of carbon, silicon, a tungsten oxide, a tin oxide, an indium oxide, a titanium oxide, and a zinc oxide, the nanowire having a width in a range from approximately 1 nm to approximately 500 nm and a length in a range from approximately 1 μm to approximately 100 μm. The nanowire sensor material piece includes a carbon nanotube (CNT) having a width in a range from approximately 1 nm to approximately 10 nm and a length in a range from approximately 1 μm to approximately 100 μm.

The substrate may be formed of a material selected from the group consisting of silicon, GaAs, glass, plastic, and ceramic.

The first and second sensor electrodes may have a comb shape and arranged in turns to engage with each other, and they may be arranged at intervals of approximately 0.3 μm to approximately 50 μm.

The suspended nanowire sensor may further include an insulation layer between the substrate and the first and second sensor electrodes.

In accordance with another aspect of the present invention, there is provided a method for fabricating a suspended nanowire sensor includes the steps of: a) forming physically separated first and second sensor electrodes on upper portions of a substrate; and b) forming a nanowire sensor material piece that extends from the first sensor electrode to the second sensor electrode and is physically suspended between the first and second sensor electrodes.

The step a) may include the steps of: a1) selectively etching the substrate to form a trench in the substrate; and a2) forming the first and second sensor electrodes on the upper portions of the substrate separated by the trench by anisotropic vacuum deposition. Herein the first and second sensor electrodes may be formed using a metal shadow mask, and the trench may be formed in the substrate by a deep reactive ion etch (DRIE) method.

Herein, the step b) may include the steps of: b1) forming a plurality of nanowires; b2) dispersing the nanowires throughout a solution; b3) moving the solution containing the nanowires on the first and second sensor electrodes; and b4) removing the solution. The step b3) may be performed by a method selected from the group consisting of drop coating, spin coating, spray coating, and dip coating.

The method furthermore includes the step of: c) forming an insulation layer between the substrate and the first and second sensor electrodes. Herein, the insulation is formed by one of thermal oxidation and atomic layer deposition (ALD).

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

Figure 1:
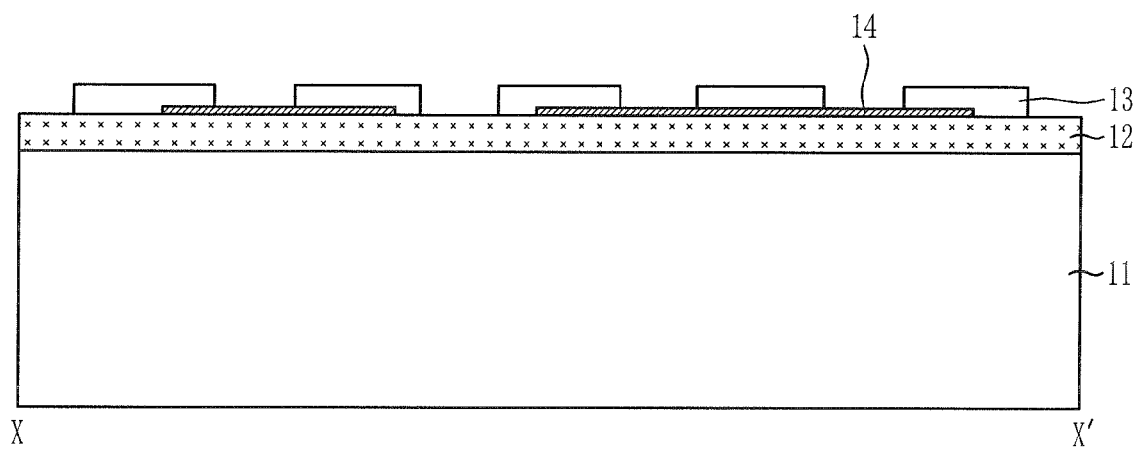
FIG. 1 is a cross-sectional view illustrating a nanowire sensor in accordance with the related art.

The advantages, features and aspects of the invention will become apparent from the following description of the embodiments with reference to the accompanying drawings, which is set forth hereinafter. In the drawings, the thicknesses of layers and regions are exaggerated for clarity, and it will also be understood that when a layer is referred to as being "on" another layer or substrate, it can be directly on the other layer or substrate, or intervening layers may also be present. Like reference numerals in the drawings denote like elements.

Figure 2A:
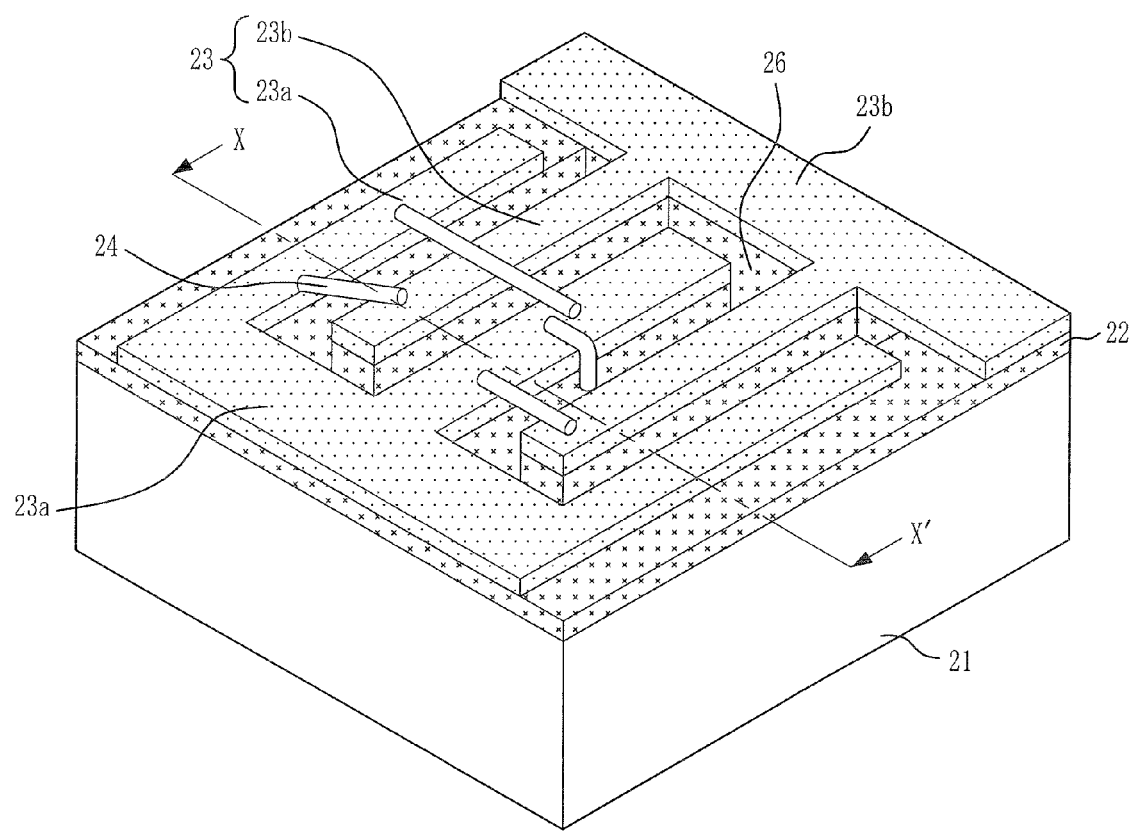
FIG. 2A is a perspective view illustrating a suspended nanowire sensor in accordance with an embodiment of the present invention.
Figure 2B:
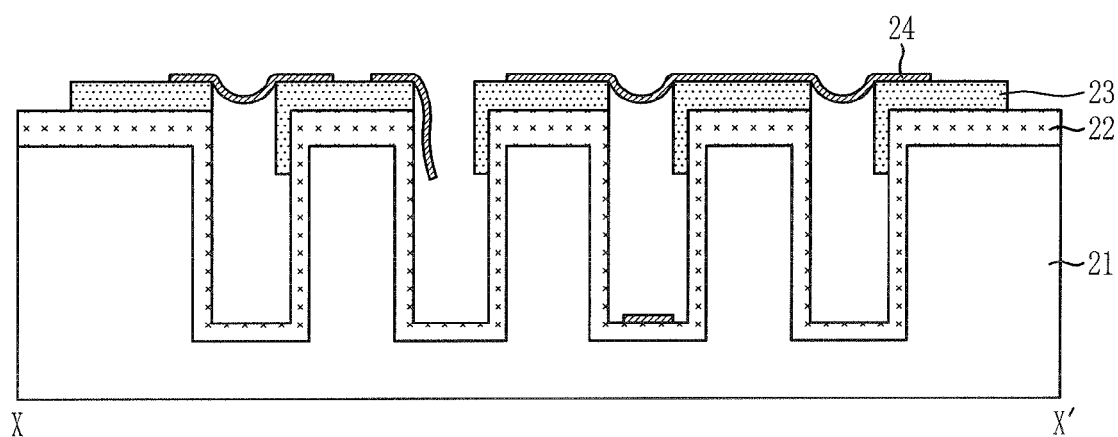
FIG. 2B is a sectional view taken along line X-X' of FIG. 2A.

FIG. 2A is a perspective view illustrating a suspended nanowire sensor in accordance with an embodiment of the present invention, and FIG. 2B is a sectional view taken along line X-X' of FIG. 2A.

Referring to FIGS. 2A and 2B, in accordance with the current embodiment of the present invention, the suspended nanowire sensor includes sensor electrodes 23 and nanowire sensor material pieces 24. The sensor electrodes 23 include first sensor electrodes 23A and second sensor electrodes 23B. The first sensor electrodes 23A and the second sensor electrodes 23B are formed above a substrate 21 and are physically separated from each other.

The nanowire sensor material pieces 24 extend from the first sensor electrodes 23A to the second sensor electrodes 23B in a manner such that the nanowire sensor material pieces 24 are suspended between the first sensor electrodes 23A and the second sensor electrodes 23B. A trench 26 is formed in the substrate 21 along a path corresponding to suspended portions of the nanowire sensor material pieces 24. The suspended nanowire sensor may further include an insulation layer 22 between the sensor electrodes 23 and the substrate 21.

In the suspended nanowire sensor in accordance with the current embodiment of the present invention, only when the nanowire sensor material pieces 24 have a length sufficiently greater than a distance between the sensor electrodes 23, the nanowire sensor material pieces 24 can provide electric connection between the sensor electrodes 23.

The nanowire sensor material pieces 24 satisfying this condition are in contact with only the sensor electrodes 23. That is, portions of the nanowire sensor material pieces 24 that are not in contact with the sensor electrodes 23 are suspended. For example, if the nanowire sensor material pieces 24 have a length smaller than the distance between the sensor electrodes 23 or are not perpendicular to the trench 26, the nanowire sensor material pieces 24 cannot provide electric connection between the sensor electrodes 23.

In the suspended nanowire sensor in accordance with the current embodiment of the present invention, the sensor electrodes 23 are formed on portions of the substrate 21 separated by the trench 26. Therefore, the width and depth of the trench 26 are important for efficiently suspending the nanowire sensor material pieces 24.

The width and depth of the trench 26 may be determined according to the size of the nanowire sensor material pieces 24 and conditions of an available semiconductor process. For example, the width of the trench 26 can range from approximately 0.3 μm to approximately 50 μm. The depth of the trench 26 may be at least larger than the width of the trench 26 so as to prevent nanowire sensor material pieces 24 having a length smaller than the distance between the sensor electrodes 23 from affecting a sensing operation.

The nanowire sensor material pieces 24 can be formed using a nanowire aggregation for easily fabricating the suspended nanowire sensor. That is, in this case, the suspended nanowire sensor can be easily mass-produced. The term "nanowire aggregation" is used to denote an aggregation in which a plurality of nanowires is included in arbitrarily directions.

The nanowire sensor material pieces 24 may be formed of nanowires having a width of approximately 1 nm to approximately 500 nm and a length of approximately 1 μm to approximately 100 μm. The nanowires may be formed of a chemical species or a photosensitive material having an electric conductivity variable according to the amount of incident light. For example, the nanowires can be formed of a material selected from the group consisting of carbon, silicon, a tungsten oxide, a tin oxide, an indium oxide, a titanium oxide, and a zinc oxide.

Alternatively, the nanowire sensor material pieces 24 can be formed of carbon nanotubes (CNTs) having a width of approximately 1 nm to approximately 10 nm and a length of approximately 1 μm to approximately 100 μm. Since CNTs can be mass-produced to a very small size, the suspended nanowire sensor can be used in various application fields in the case where the nanowire sensor material pieces 24 are formed of CNTs.

The sensor electrodes 23 can have various shapes for efficiently detecting variations in the electric conductivity of the nanowire sensor material pieces 24. For example, the first sensor electrodes 23A can be arranged in parallel with the second sensor electrodes 23B.

Alternatively, the first sensor electrodes 23A and the second sensor electrodes 23B can be shaped like a comb and arranged in turns to engage with each other, as shown in FIG. 2A. In the case where the first and second sensor electrodes 23A and 23B have a comb-like shape and are arranged in turns, contact areas between the sensor electrodes 23 and the nanowire sensor material pieces 24 can be increased.

The sensor electrodes 23 may be arranged at intervals of approximately 0.3 µm to approximately 50 µm. The sensor electrodes 23 may be formed using one of a metal layer, a conductive metal nitride layer such as a titanium nitride (TiN) layer, and a polysilicon layer. For example, the metal layer can be formed of a material selected from the group consisting of gold (Au), platinum (Pt), aluminum (Al), molybdenum (Mo), silver (Ag), tungsten (W), ruthenium (Ru), and iridium (Ir) and combinations thereof.

The substrate 21 may be formed of an inexpensive material. For example, the substrate 21 can be formed of an expensive material selected from the group consisting of silicon, GaAs, glass, plastic, and ceramic.

The nanowire sensor material pieces 24 can be formed using a nanowire aggregation as described above. In this case, the suspended nanowire sensor can be easily mass-produced.

The nanowire sensor material pieces 24 are physically suspended between the sensor electrodes 23 owing to the trench 26 formed between the sensor electrodes 23. Interaction between the nanowire sensor material pieces 24 can be reduced, thereby increasing the sensing characteristics of the suspended nanowire sensor. Furthermore, the nanowire sensor material pieces 24 can be effectively prevented from contacting the substrate 21 to increase the sensing characteristics of the suspended nanowire sensor.

FIGS. 3A to 3D illustrate cross-sectional views corresponding to FIG. 2B taken along line X-X' of FIG. 2A for explaining a method for fabricating a suspended nanowire sensor in accordance with an embodiment of the present invention.

Figure 3A:
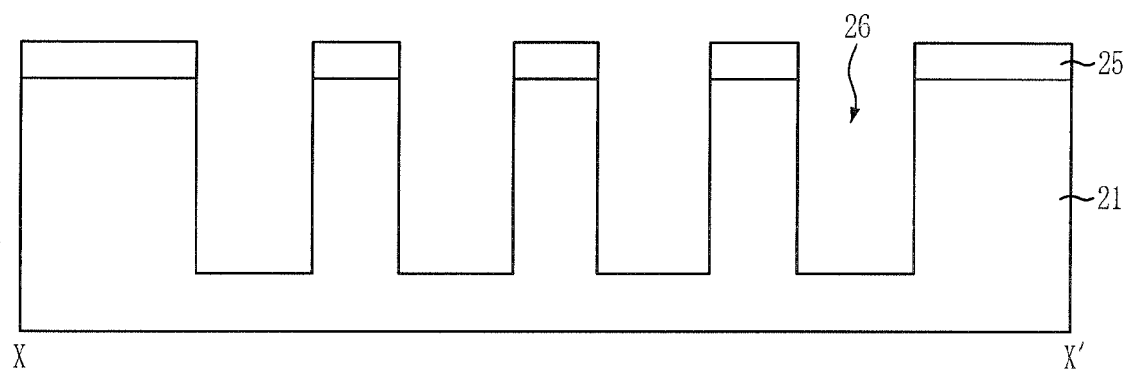
FIGS. 3A to 3D are cross-sectional views for explaining a method for fabricating a suspended nanowire sensor in accordance with an embodiment of the present invention.

Referring to FIG. 3A, a hard mask pattern 25 is formed on the entire surface of the substrate 21. In accordance with the current embodiment of the present invention, sensor electrodes will be formed on upper portions of the substrate 21 separated by a trench. Therefore, the hard mask pattern 25 that will be used to form a trench in the substrate 21 may be shaped based on the shape of the sensor electrodes.

The hard mask pattern 25 can have a straight-slit shape or a zigzag shape. For example, the hard mask pattern 25 can have a zigzag shape (refer to FIG. 2A) so as to increase contact areas between nanowire sensor material pieces and sensor electrodes that will be formed in a subsequent process.

The hard mask pattern 25 can be formed by thermal oxidation or chemical vapor deposition (CVD). The hard mask pattern 25 can be formed into a single-layer or multi-layer structure using one or more of an oxide layer, a nitride layer, and an oxynitride layer. For example, the oxide layer can be formed of one of a silicon oxide ($SiO_2$), boron phosphorus silicate glass (BPSG), phosphorus silicate glass (PSG), tetra ethyle ortho Silicate (TEOS), un-doped silicate glass (USG), spin on glass (SOG), high density plasma (HDP), and spin on dielectric (SOD). The nitride layer can be formed of a silicon nitride ($Si_3N_4$).

An in expensive substrate, such as a silicon substrate, a GaAs substrate, a glass substrate, a plastic substrate, and a ceramic substrate, can be used as the substrate 21.

Next, the substrate 21 is etched using the hard mask pattern 25 as an etch barrier so as to form a trench 26 in the substrate 21. The depth of the trench 26 may be sufficiently larger than the width of the trench 26. In this case, nanowire sensor material pieces that will be formed in a subsequent process can be effectively suspended.

The trench 26 can be formed through one of a dry etch process or a wet etch process. For example, the trench 26 can be formed through a dry etch process such as a deep reactive ion etch (DRIE) process. In this case, the profile of the trench 26 can be easily controlled as compared with the case of using a wet etch process.

In the DRIE process, dry etching and forming of a high-polymer passivation layer are repeated in turns to anisotropically etch away a bottom portion of the trench 26 while protecting sidewalls of the trench 26 using the high-polymer passivation layer. When the DRIE process is used, the trench 26 can be formed in the substrate 21 to a depth of several tens to several hundreds of micrometers.

Figure 3B:
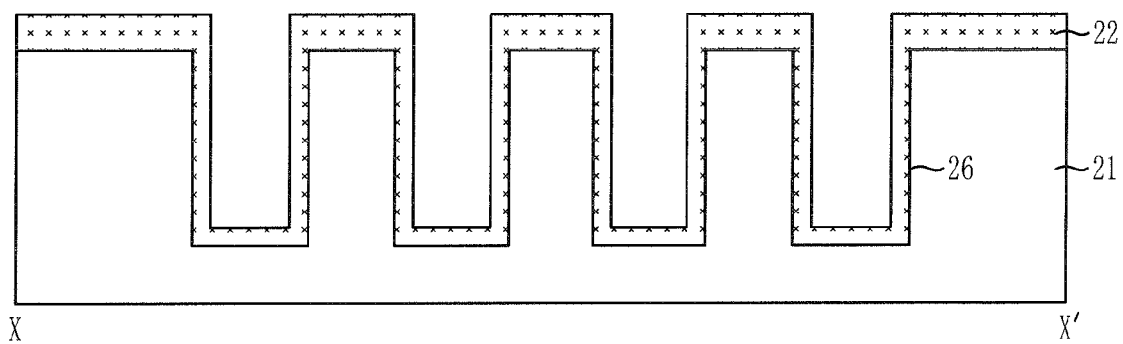

Referring to FIG. 3B, the hard mask pattern 25 is removed, and a heat treatment process is performed to remove contaminants and smooth the sidewalls of the trench 26 that become rough during the DRIE process. The heat treatment process can be performed in an oxygen ($O_2$) atmosphere at a temperature of approximately 800° C.

Next, an insulation layer 22 is formed on the entire surface of the substrate 21 including the trench 26. The insulation layer 22 electrically disconnects the substrate 21 from sensor electrodes that will be formed in a subsequent process. The insulation layer 22 may be formed by one thermal oxidation and atomic layer deposition (ALD). The insulation layer 22 may be formed of an aluminum oxide to a thickness of approximately 80 nm.

Instead of forming the insulation layer 22 using alumina, the insulation layer 22 can be formed of a material selected from the group consisting of an oxide, a nitride, or an oxynitride.

Figure 3C:
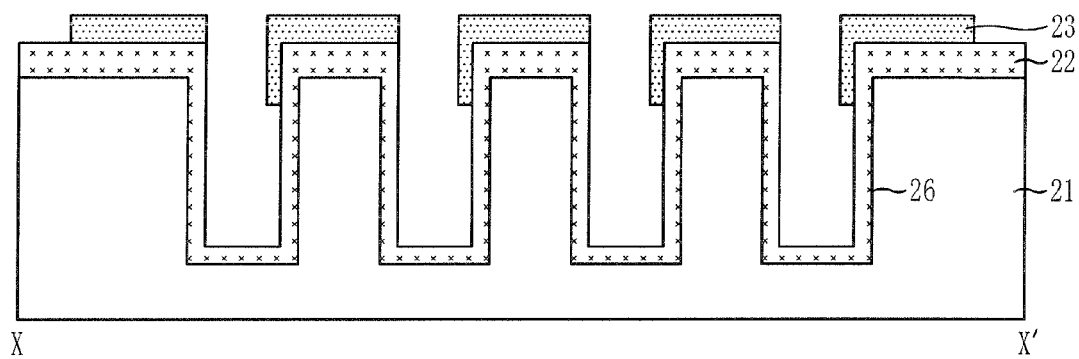

Referring to FIG. 3C, sensor electrodes 23 are formed on upper portions of the substrate 21 that are separated by the trench 26. After selecting a region for the sensor electrodes 23 by using a metal shadow mask, the sensor electrodes 23 can be formed on the upper portions of the substrate 21 by anisotropic vacuum deposition without an additional patterning process.

In detail, after placing a metal shadow mask on the substrate 21, the substrate 21 is moved into a reaction chamber. Next, an electrode source material such as gold (Au) is placed in the reaction chamber at an opposite side to the substrate 21. Thereafter, the electrode source material is evaporated by a thermal evaporation method or an electron beam evaporation method so as to form the sensor electrodes 23 by depositing the evaporated electrode source material.

Herein, the substrate 21 can be inclined at an angle (e.g., 8°) from a direction in which the evaporated electrode source material flows so as to form the sensor electrodes 23 in present invention regions of the substrate 21. That is, in this way, the sensor electrodes 23 can be formed on portions of the insulation layer 22 that are separated by the trench 26.

The shape or arrangement of the sensor electrodes 23 can be changed for effectively detect variations in electric conductivity of nanowire sensor material pieces that will be formed in a subsequent process.

For example, the sensor electrodes 23 can be arranged in parallel with each other. Alternatively, the sensor electrodes 23 can be formed into a comb-like shape and arranged in turns to engage with each other so as to increase contact areas between the sensor electrodes 23 and the nanowire sensor material pieces.

The sensor electrodes 23 may be arranged at intervals of approximately 0.3 µm to approximately 50 µm to allow the nanowire sensor material pieces to be effectively suspended on the sensor electrodes 23. The sensor electrodes 23 may be formed using one of a metal layer, a conductive metal nitride layer such as a titanium nitride (TiN) layer, and a polysilicon layer. For example, the metal layer can be formed of a material selected from the group consisting of gold (Au), platinum (Pt), aluminum (Al), molybdenum (Mo), silver (Ag), tungsten (W), ruthenium (Ru), and iridium (Ir).

Figure 3D:
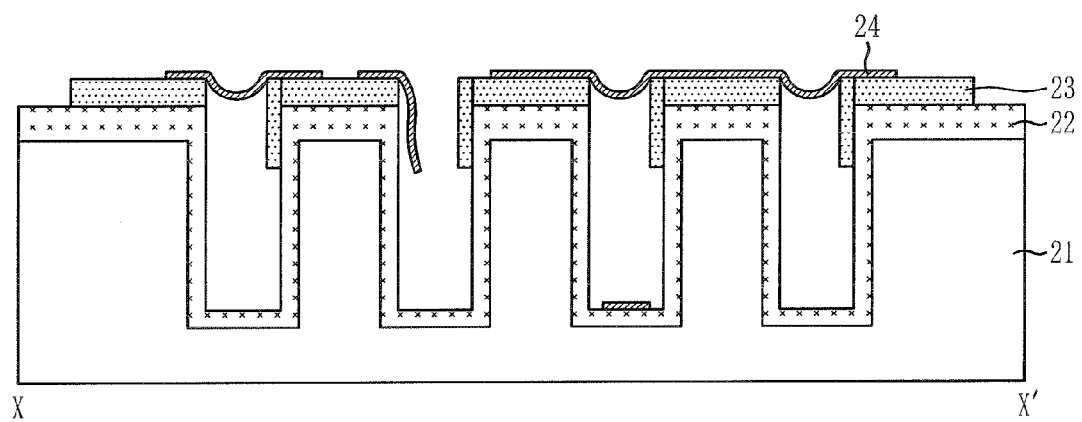

Referring to FIG. 3D, nanowire sensor material pieces 24 are formed on the sensor electrodes 23. The nanowire sensor material pieces 24 can be formed of single wall carbon nanotubes (SW-CNTs).

Alternatively, the nanowire sensor material pieces 24 can be formed using nanowires. The nanowires may be formed of a material selected from the group consisting of carbon, silicon, a tungsten oxide, a tin oxide, an indium oxide, a titanium oxide, and a zinc oxide. The nanowires may have a width of approximately 1 nm to approximately 500 nm and a length of approximately 1 µm to approximately 100 µm.

The nanowires can be formed by well-known methods. For example, the nanowires can be formed by chemical vapor deposition (CVD), a synthesizing method using an arc, a template method using a material such as an anodic aluminum oxide or an polycarbonate membrane polymer, or a solvothermal method of applying heat and a surface active agent to a solution. Since these methods are well known, descriptions thereof will be omitted.

A method of forming SW-CNTs on the sensor electrodes 23 will now be described in detail.

An SW-CNT aggregation prepared using a well-known method is dispersed throughout a solution. Here, a solvent such as dimethyl formamide (DMF) can be used. Instead of DMF, a typical organic solvent such as ethanol can be used to disperse the SW-CNT aggregation. If the SW-CNT aggregation is not easily dispersed throughout the solution since the SW-CNT aggregation is not readily dissolved in the solvent, physical impacts such as an ultrasonic impact can be applied to the SW-CNT aggregation to facilitate dispersion of the SW-CNT aggregation.

Next, the solution containing the dispersed SW-CNT aggregation is applied to upper portions of the sensor electrodes 23 by, for example, drop coating (dispersing), spin coating, spray coating, or dip coating. Next, the sensor electrodes 23 coated with the solution are kept in a vacuum at a temperature of approximately 150° C. for ten hours or more so as to evaporate the solvent. In this way, SW-CNTs can be formed on the sensor electrodes 23 as the nanowire sensor material pieces 24.

Then, a heat treatment is performed to improve contact characteristics between the sensor electrodes 23 and the nanowire sensor material pieces 24. The heat treatment can be performed at a temperature of approximately 300° C. or higher.

As explained above, since the nanowire sensor material pieces 24 of the suspended nanowire sensor are formed using a nanowire aggregation, the suspended nanowire sensor can be easily mass-produced.

Furthermore, the nanowire sensor material pieces 24 can be physically suspended on the sensor electrodes 23 owing to the trench 26 formed between the sensor electrodes 23. Therefore, interaction between the nanowires of the nanowire sensor material pieces 24 can be reduced, and thus the sensing characteristics of the suspended nanowire sensor can be improved.

Furthermore, since the nanowire sensor material pieces 24 are effectively prevented from contacting the substrate 21 so that the sensing characteristics of the suspended nanowire sensor can be improved.

Furthermore, when fabricating the suspended nanowire sensor in accordance with an embodiment the present invention, the sensor electrodes 23 are formed by anisotropic vacuum deposition so that an additional patterning process is not necessary for forming the sensor electrodes 23. Therefore, the suspended nanowire sensor can be fabricated through a simple process with lower costs.

In addition, since the method for fabricating the suspended nanowire sensor in accordance with the present invention is compatible with conventional semiconductor manufacturing processes, the suspended nanowire sensor can be easily used in many application fields. For example, the suspended nanowire sensor can be easily applied to a system-on-chip (SOC).

Figure 4A:
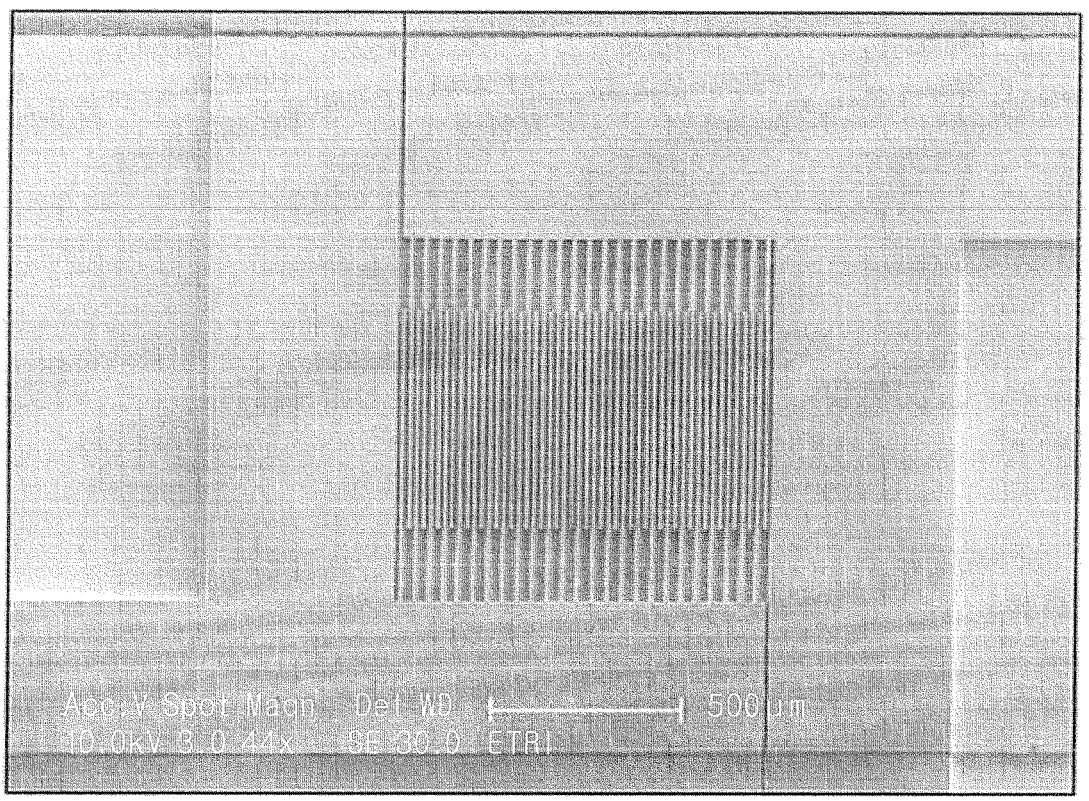
FIGS. 4A to 4C are scanning electron microscope (SEM) images of a suspended nanowire sensor fabricated in accordance with an embodiment of the present invention.
Figure 4B:
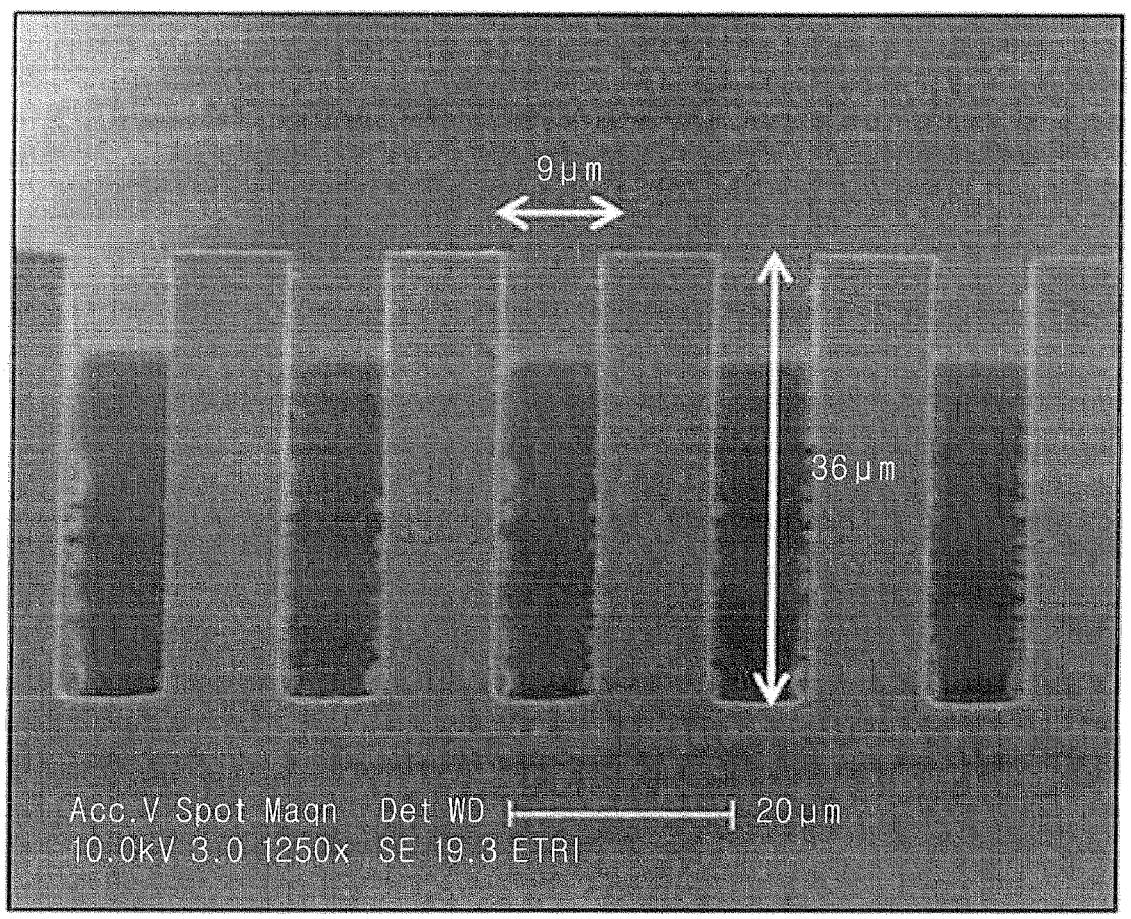
Figure 4C:
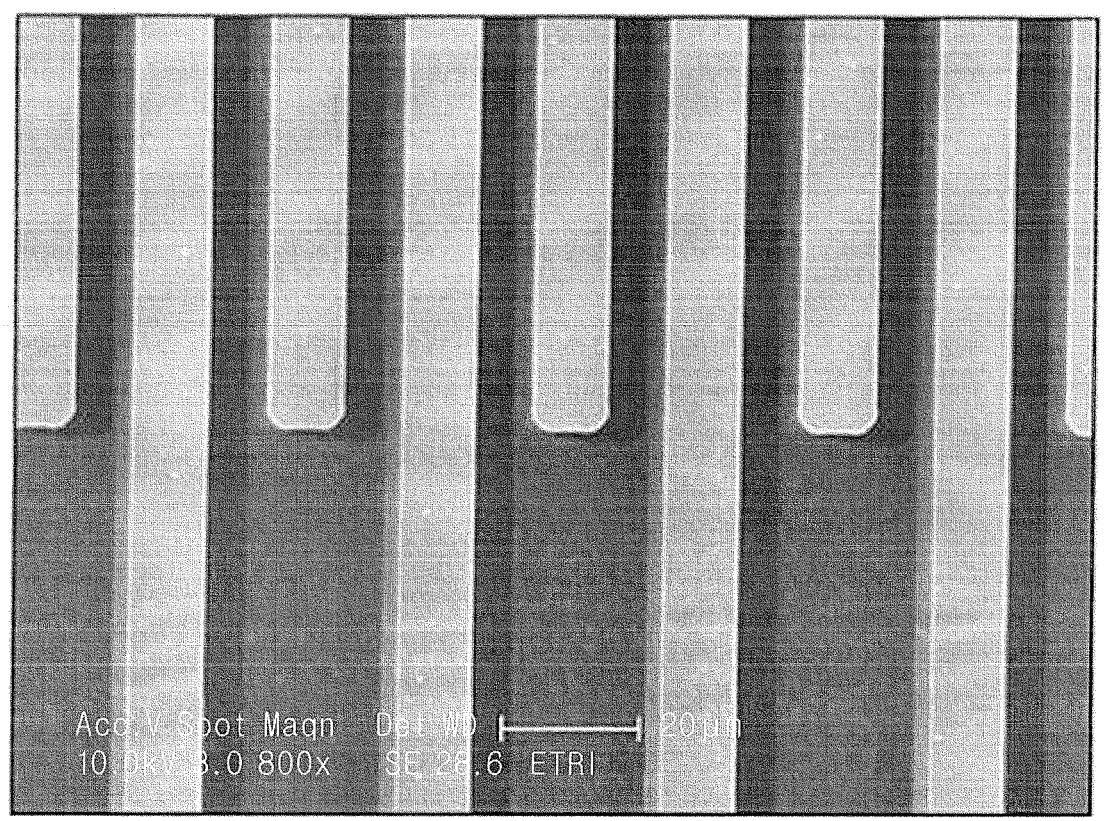

FIGS. 4A to 4C are scanning electron microscope (SEM) images of a suspended nanowire sensor fabricated in accordance with an embodiment of the present invention.

Referring to FIG. 4A, rows of sensor electrodes engage with each other like two combs engaged with each other. A region where metal is deposited using a metal shadow mask can be distinguished from a region where metal is not deposited by upper and lower horizontal lines. The region in which metal is deposited is located between the upper and lower horizontal lines. In detail, gold (Au) is deposited in the region between the upper and lower horizontal lines by anisotropic vacuum deposition to form the sensor electrodes.

Referring to FIG. 4B, dimensions of a trench formed in the suspended nanowire sensor are shown. The width of the trench (a distance between the sensor electrodes) is approximately 9 µm, and the depth of the trench is approximately 36 µm.

Although not clear in FIG. 4B, an aluminum oxide layer is formed to a thickness of approximately 80 nm as an insulation layer. Here, it can be determined whether the insulation layer is uniform by measuring the electric conductivity of the insulation layer and the reflected color of a substrate.

Referring to FIG. 4C, the sensor electrodes are formed by depositing gold (Au) by anisotropic deposition at a deposition angle of about 8°. The left side of the sensor electrode is brighter than the right side of the sensor electrode since gold (Au) is deposited from the left side to the right side. The sensor electrodes are electrically disconnected, and this is checked by resistance measurement.

Figure 5:
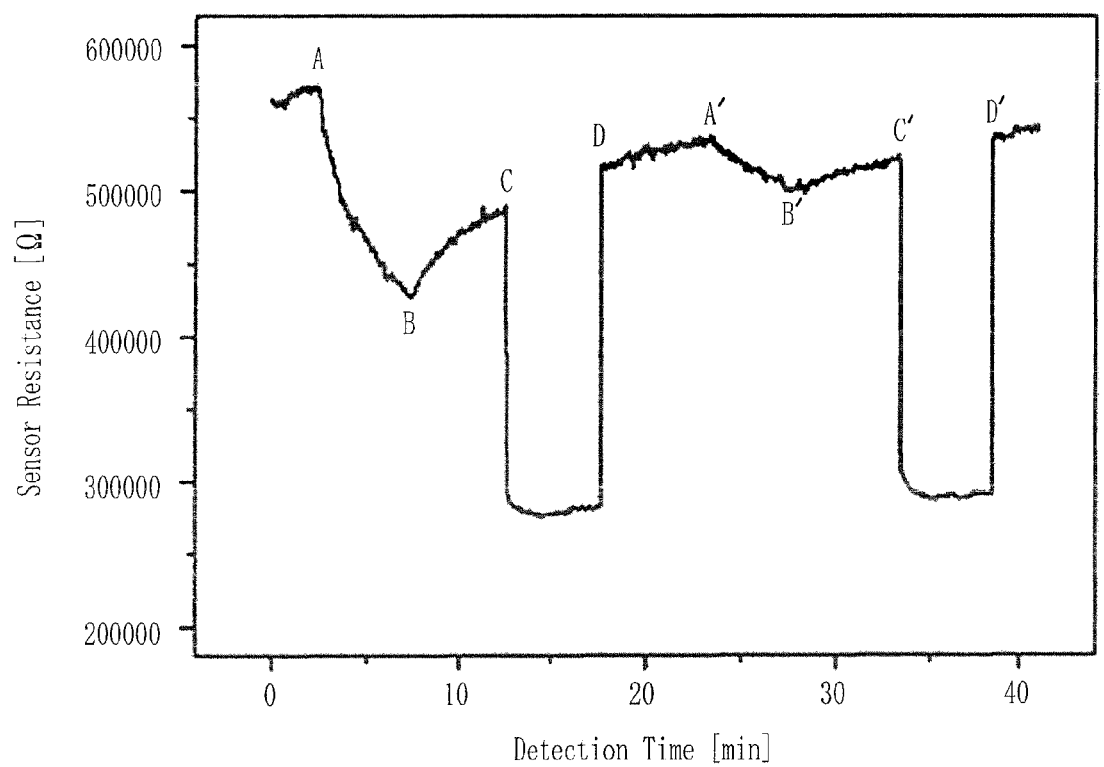
FIG. 5 is a reaction curve graph illustrating variations of the resistance of a suspended nanowire sensor fabricated in accordance with an embodiment of the present invention when the suspended nanowire sensor is exposed to $NO_2$ and 356-nm ultraviolet light.

FIG. 5 is a reaction curve graph illustrating variations of the resistance of a suspended nanowire sensor fabricated in accordance with an embodiment of the present invention when the suspended nanowire sensor is exposed to $NO_2$ and 356-nm ultraviolet light.

In FIG. 5, section A-B was obtained by exposing the suspended nanowire sensor to 1-ppm $NO_2$ molecules; section B-C was obtained by exposing the suspended nanowire sensor only to dry air; section C-D was obtained by exposing the suspended nanowire sensor to ultraviolet light; and section D-A' was obtained after interrupting the ultraviolet light irradiated onto the suspended nanowire sensor. Sections A'-B', B'-C', and C'-D' are obtained in the same conditions as sections A-B, B-C, and C-D except that section A'-B' was obtained by exposing the suspended nanowire sensor to 0.1-ppm $NO_2$ molecules.

Referring to FIG. 5, when SW-CNTs were used as a nanowire sensor material for the suspended nanowire sensor, the suspended nanowire sensor showed a p-type sensing reaction for a chemical species, and the degree of the p-type sensing reaction of the suspended nanowire sensor was varied according to the concentration of the chemical species. The electric conductivity of the SW-CNTs was increased by ultraviolet light. The reason for this is that new charge carriers such as electrons or holes are generated in the SW-CNTs by the ultraviolet light.

As described above, in accordance with the present invention, the nanowire sensor material pieces of the suspended nanowire sensor are formed using a nanowire aggregation so that the suspended nanowire sensor can be easily mass-produced.

Furthermore, the nanowire sensor material pieces are physically suspended between the sensor electrodes owing to the trench formed between the sensor electrodes so that interaction between the nanowire sensor material pieces can be minimized, and thus the suspended nanowire sensor can have improved sensing characteristics. In addition, the nanowire sensor material pieces are effectively prevented from contacting the substrate so that the sensing characteristics of the suspended nanowire sensor can be increased.

Moreover, the sensor electrodes are formed by anisotropic vacuum deposition so that the sensor electrodes can be formed into a fine structure without having to perform an additional patterning process. Therefore, the suspended nanowire sensor can be fabricated through simple processes with lower costs.

In addition, the method for fabricating a suspended nanowire sensor in accordance with the present invention is largely compatible with conventional semiconductor manufacturing processes so that the suspended nanowire sensor can be easily used in many application fields. For example, the suspended nanowire sensor can be easily applied to a system-on-chip (SOC).

While the present invention has been described with respect to the specific embodiments, it will be apparent to those skilled in the art that various changes and modifications may be made without departing from the spirit and scope of the invention as defined in the following claims.

What is claimed is:

1. A suspended nanowire sensor, comprising:
   first and second sensor electrodes formed on upper portions of a semiconductor substrate and physically separated from each other by a trench in the semiconductor substrate, the depth of the trench being greater than the width;
   a nanowire sensor material piece extending from the first sensor electrode to the second sensor electrode and physically suspended between the first and second sensor electrodes; and
   an insulation layer between the substrate and the first and second sensor electrodes.

2. The suspended nanowire sensor of claim 1, wherein the trench is formed in a portion of the substrate corresponding to a portion of the nanowire sensor material piece suspended between the first and second sensor electrodes.

3. The suspended nanowire sensor of claim 1, wherein the nanowire sensor material piece is formed of a material having electric conductivity varying in response to a chemical species or light.

4. The suspended nanowire sensor of claim 1, wherein the substrate is formed of a material selected from the group consisting of silicon, GaAs, glass, plastic, and ceramic.

5. The suspended nanowire sensor of claim 1, wherein the first and second sensor electrodes have a comb shape and arranged in turns to engage with each other.

6. The suspended nanowire sensor of claim 1, wherein the first and second sensor electrodes are arranged at intervals of approximately 0.3 µm to approximately 50 µm.

7. The suspended nanowire sensor of claim 3, wherein the nanowire sensor material piece includes a nanowire formed of a material selected from the group consisting of carbon, silicon, a tungsten oxide, a tin oxide, an indium oxide, a titanium oxide, and a zinc oxide, the nanowire having a width in a range from approximately 1 nm to approximately 500 nm and a length in a range from approximately 1 µm to approximately 100 µm.

8. The suspended nanowire sensor of claim 4, wherein the nanowire material piece includes a carbon nanotube (CNT) having a width in a range from approximately 1 nm to approximately 10 nm and a length in a range from approximately 1 µm to approximately 100 µm.

9. A method for fabricating a suspended nanowire sensor, the method comprising the steps of:
   a) forming a trench in a semiconductor substrate and first and second sensor electrodes on upper portions of the semiconductor substrate so that the depth of the trench is greater than the width of the trench and the first and second sensor electrodes are physically separated by the trench;
   b) forming a nanowire sensor material piece that extends from the first sensor electrode to the second sensor electrode and is physically suspended between the first and second sensor electrodes; and
   c) forming an insulation layer between the substrate and the first and second sensor electrodes.

10. The method of claim 9, wherein the step a) includes the steps of:
    a1) selectively etching the substrate to form the trench in the substrate; and
    a2) forming the first and second sensor electrodes on the upper portions of the substrate separated by the trench by anisotropic vacuum deposition.

11. A method for fabricating a suspended nanowire sensor, the method comprising the steps of:
    a) forming a trench in a substrate and first and second sensor electrodes on upper portions of the substrate so that the depth of the trench is greater than the width of the trench and the first and second sensor electrodes are physically separated by the trench; and
    b) forming a nanowire sensor material piece that extends from the first sensor electrode to the second sensor electrode and is physically suspended between the first and second sensor electrodes,
    wherein the step a) includes the steps of:
    a1) selectively etching the substrate to form the trench in the substrate; and
    a2) forming the first and second sensor electrodes on the upper portions of the substrate separated by the trench by anisotropic vacuum deposition, and
    wherein the first and second sensor electrodes are formed using a metal shadow mask.

12. The method of claim 10, wherein the anisotropic vacuum deposition includes electron beam evaporation or thermal evaporation.

13. The method of claim 10, wherein the trench is formed in the substrate by a deep reactive ion etch (DRIE) method.

14. The method of claim 9, wherein the insulation is formed by one of thermal oxidation and atomic layer deposition (ALD).

15. The method of claim 9, wherein the step b) includes the steps of:
- b1) forming a plurality of nanowires;
- b2) dispersing the nanowires throughout a solution;
- b3) moving the solution containing the nanowires on the first and second sensor electrodes; and
- b4) removing the solution.

16. The method of claim 15, wherein the step b3) is performed by a method selected from the group consisting of drop coating, spin coating, spray coating, and dip coating.

17. The suspended nanowire sensor of claim 1, wherein the insulation layer is formed on a top surface of an untrenched region of the substrate and on a trench bottom of the substrate, and
- wherein a bottom surface of the insulation layer formed on the top surface of the untrenched region is disposed at a level higher than a bottom surface of the insulation layer formed on the trench bottom.

18. The method of claim 9, wherein, after the trench is formed in the substrate, the first and second sensor electrodes are formed on a top surface of an untrenched region of the substrate.

* * * * *